(12) United States Patent
Liu et al.

(10) Patent No.: US 8,164,060 B2
(45) Date of Patent: *Apr. 24, 2012

(54) SYSTEM AND METHOD FOR A CHARGED PARTICLE BEAM

(75) Inventors: Xuedong Liu, Cupertino, CA (US); Xu Zhang, Hayward, CA (US); Joe Wang, Campbell, CA (US); Edward Tseng, Jubei (TW); Zhongwei Chen, San Jose, CA (US)

(73) Assignee: Hermes-Microvision, Inc., Taiwan (CN)

( * ) Notice: Subject to any disclaimer, the term of this patent is extended or adjusted under 35 U.S.C. 154(b) by 111 days.

This patent is subject to a terminal disclaimer.

(21) Appl. No.: 12/832,127

(22) Filed: Jul. 8, 2010

(65) Prior Publication Data

US 2010/0270468 A1    Oct. 28, 2010

Related U.S. Application Data

(63) Continuation of application No. 11/923,012, filed on Oct. 24, 2007, now Pat. No. 7,825,386.

(60) Provisional application No. 60/862,943, filed on Oct. 25, 2006.

(51) Int. Cl.
*H01J 37/244* (2006.01)
*H01J 37/145* (2006.01)

(52) U.S. Cl. ............ 250/310; 250/395 ML; 250/396 R; 250/397

(58) Field of Classification Search .............. 250/396 R, 250/396 ML, 306, 307, 309–311, 397–399
See application file for complete search history.

(56) References Cited

U.S. PATENT DOCUMENTS

| | | | |
|---|---|---|---|
| 4,831,266 A | 5/1989 | Frosien et al. | |
| 6,855,938 B2 | 2/2005 | Preikszas et al. | |
| 6,897,450 B2 * | 5/2005 | Yonezawa | 250/396 R |
| 7,821,187 B1 * | 10/2010 | Jiang et al. | 313/361.1 |
| 7,825,386 B2 * | 11/2010 | Liu et al. | 250/396 ML |

* cited by examiner

*Primary Examiner* — Bernard E Souw
(74) *Attorney, Agent, or Firm* — Kilpatrick Townsend & Stockton LLP

(57) ABSTRACT

System and method for charged particle beam. According an embodiment, the present invention provides a charged particle beam apparatus. The apparatus includes a charged particle source for generating a primary charged particle beam. The apparatus also includes at least one condenser lens for pre-focusing the primary charge particle beam. Furthermore, the apparatus includes a compound objective lens for forming the magnetic field and the electrostatic field to focus the primary charged particle beam onto a specimen in the charged particle beam path. The specimen includes a specimen surface. The compound objective lens includes a conical magnetic lens, an immersion magnetic lens, and an electrostatic lens, the conical magnetic lens including an upper pole piece, a shared pole piece being electrically insulated from the upper pole piece, and an excitation coil.

20 Claims, 8 Drawing Sheets

SYSTEM AND METHOD FOR A CHARGED PARTICLE BEAM

CROSS-REFERENCES TO RELATED APPLICATIONS

This application is a Continuation Application from U.S. application Ser. No. 11/923,012 filed Oct. 24, 2007 which claims priority to U.S. Provisional Application No. 60/862,943, filed Oct. 25, 2006, which is incorporated herein by reference for all purposes.

BACKGROUND OF THE INVENTION

This invention relates to system and method for charged particle beam. More specifically, embodiments of the present invention provides a apparatus for generating and focusing primary charged particle beam onto a conductive or non-conductive specimen and collecting the released charged particles and/or X-ray from the specimen to form an image/or a spectrum of the specimen. Merely by way of example, the present invention has been used to provide a low-landing scanning electron microscope, but it would be recognized that the invention has a much broader range of applicability.

The low landing energy and high resolution charged particle beam apparatus, (e.g. scanning electron microscope, or SEM) is an important metrology tool for inspection, review of defects of semiconductor wafer and for measurement of the critical dimensions (CD) of the integrated circuit (IC) pattern. It can help accelerate the new wafer processing technology ramp and improve the yield during mass production. Over the past, various conventional SEM systems and related techniques have been developed for different purpose. However, it still is a big challenge for high resolution, low landing energy and small spot size for prior arts.

BRIEF SUMMARY OF THE INVENTION

This invention relates to system and method for charged particle beam. More specifically, embodiments of the present invention provides a apparatus for generating and focusing primary charged particle beam onto a conductive or non-conductive specimen and collecting the released charged particles and/or X-ray from the specimen to form an image/or a spectrum of the specimen. Merely by way of example, the present invention has been used to provide a low-landing scanning electron microscope, but it would be recognized that the invention has a much broader range of applicability.

An object of the present invention is to provide a charged particle apparatus and methods to focus the accelerated primary charged particle onto the specimen, and to collect the charged particle beams emanating from the specimen surface to form a high-resolution image of the specimen. According to various embodiments, the present invention provides a charged particle beam apparatus that includes, among other things, a compound objective lens that is capable of apply adjustable voltage on a specimen, thereby allowing efficient image capturing.

According an embodiment, the present invention provides a charged particle beam apparatus. The apparatus includes a charged particle source for generating a primary charged particle beam. The apparatus also includes at least one condenser lens for pre-focusing the primary charge particle beam. Furthermore, the apparatus includes a compound objective lens for forming the magnetic field and the electrostatic field to focus the primary charged particle beam onto a specimen in the charged particle beam path. The specimen includes a specimen surface. The compound objective lens includes a conical magnetic lens, an immersion magnetic lens, and an electrostatic lens, the conical magnetic lens including an upper pole piece, a shared pole piece being electrically insulated from the upper pole piece, and an excitation coil. A bottom surface of the shared pole piece is approximately 1 to 8 millimeters from the specimen. The pole piece is characterized by a bore diameter of approximately 1 to 30 millimeters. The apparatus also includes a detection system for detecting signal charged particles or X-ray emanated from the specimen. The apparatus further includes an ExB filter for aligning or bending the signal charged particle beam to detector. Moreover, the apparatus includes a deflection system for deflecting the primary charged particle beam over the specimen surface to form a scanning pattern. Additionally, the apparatus includes a stage system for supporting and moving the specimen.

Another object of this invention is to provide a method to analyze the elemental composition of the detected defect of unfinished IC pattern with EDX (Energy Dispersive X-Ray).

Detailed objects and features of the invention will appear in the course of the description thereof, which follows.

According to an embodiment, a charged particle beam apparatus includes a charge particle source, one or more condenser lens, compound magnetic-electrostatic objective lenses, a deflection system and a signal detection system.

As an example, the charged particle source consists of an emission cathode and an anode. A positive potential can be applied onto the anode and the condenser lens with respect to the ground to achieve the high kinetic energy charged particle beam to minimize the beam interaction effects, which can affect the beam final spot size.

The compound objective lens comprises a conical magnetic lens, an immersion magnetic lens and an electrostatic lens. The conical magnetic lens includes an upper pole piece, a shared pole piece and a focusing coil. The immersion magnetic lens includes a shared pole piece, a lower pole piece and its own focusing coil. The conical magnetic lens and the immersion magnetic lens share a same "shared pole piece" in its structure. When the conical magnetic lens works as the primary focusing objective lens, high landing energy beam and a large scanning field of view are achievable; and side detectors can collect the side-view image of the specimen.

Correspondingly EDX analysis can also be performed. For example, when the immersion magnetic objective lens works as primary focusing objective lens, very high resolution scanning image can be achieved for the extra low landing energy charged particle beam. A different voltage with respect to the specimen surface can be applied to the shared pole piece of the magnetic objective lens or an additional electrode positioned between the shared pole piece and the specimen to adjust the strength of electrostatic field at the surface of specimen. In order to apply various voltages onto the shared pole piece, the shared pole piece is electrically insulated from the upper pole piece. The voltage on the lower pole piece of the immersion magnetic lens is the same as the voltage on the specimen to make electrostatic field free at other portions of the specimen surface.

The EDX function can be accomplished by focusing the primary charged particle beam with a landing energy up to 12 keV onto the specimen; the characteristic X-rays of the elements are then generated due to the interaction of the primary charged beam with the specimen. An EDX detector positioned at proper location collects the released X-ray. Further analysis is then performed to get the essential elemental information of the defects.

According to an embodiment, the detection system comprises an in-lens charged particle segmental detector, at least one charged particle side-detector and at least one X-ray detector. The in-lens segmental detector is located at the optical axis of the charged particle beam apparatus. The charged particle side-detector is arranged between the shared pole piece and said lower pole piece of the magnetic lens. Said X-ray detector is located between the shared pole piece and said lower pole piece of magnetic lens to collect the characteristic X-Ray emanated from the specimen.

An in-lens electrostatic deflector is located between the upper pole pieces and the shared pole piece of the conical magnetic lens and immersion magnetic lens to achieve large scanning field. The in-lens deflector can have the same voltage as the upper pole piece or the shared pole piece of the magnetic lens.

When the anode, the shared pole of the compound objective lens, optional electrostatic electrode and the specimen are provided with different specified voltages, different landing energy and correspondingly different operation mode can be achieved.

The specimen sits on a Z-stage, which supported by a movable X-Y stage so that the different portion of the specimen can be scanned by the primary charged particle beam. After the X-Y stage moves different portion of specimen to the optical axial area to be scanned by the primary focused charged particle beam, the Z-stage will adjust the height of the specimen to the focused-imaging plane of the primary charged particle beam. Fine focusing can be achieved by adjusting one, or more than one of the voltages applied onto the cathode, the anode, the condenser lens, the shared pole piece, the optional electrode (which is located between the shared pole piece and specimen), and the specimen.

Various additional objects, features and advantages of the present invention can be more fully appreciated with reference to the detailed description and the accompanying drawings that follow.

DETAILED DESCRIPTION OF THE INVENTION

Figure 1:
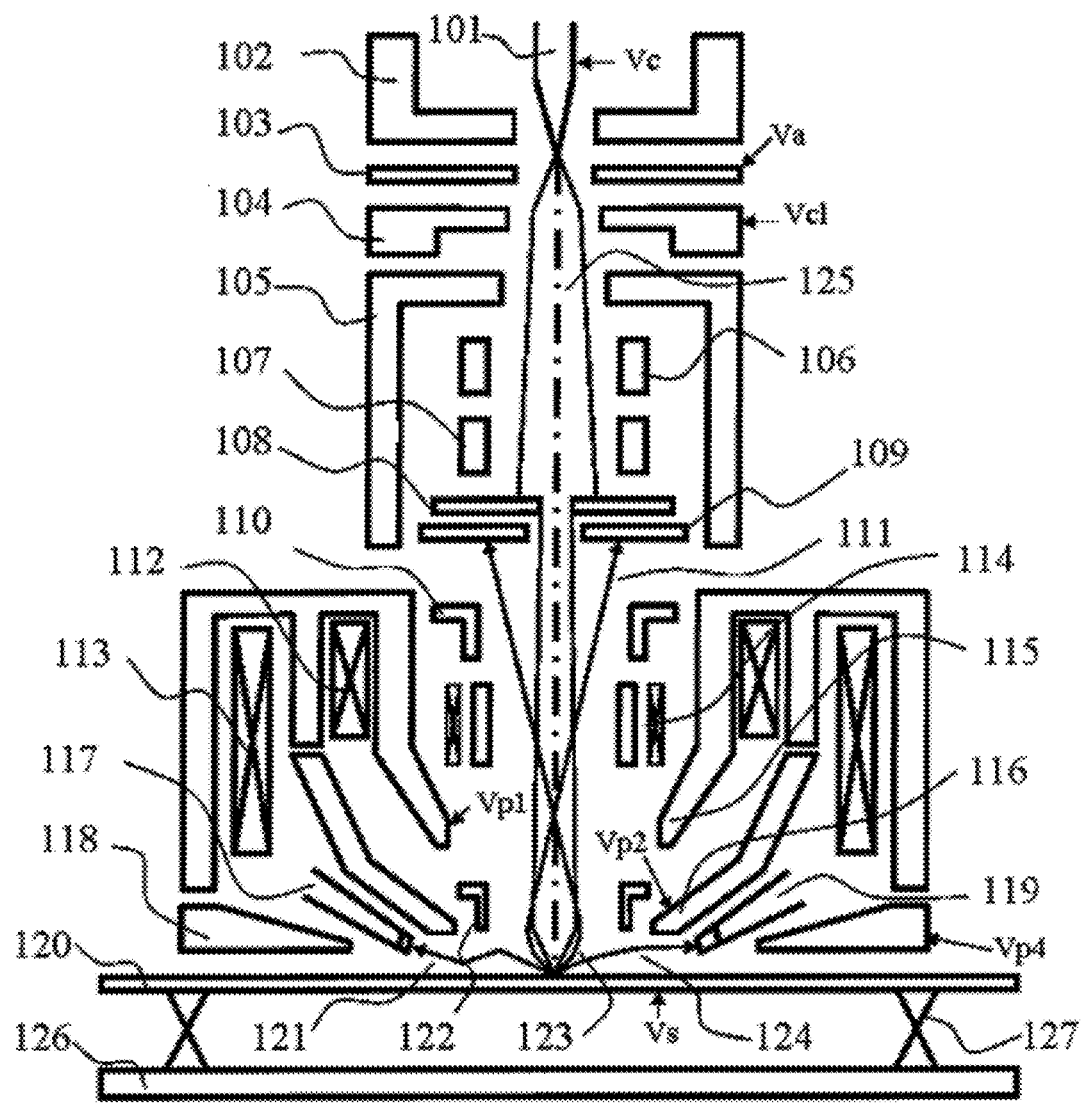
FIG. 1 is a simplified diagrammatic representation of a charged particle apparatus according to an embodiment of the present invention.

This invention relates to system and method for charged particle beam. More specifically, embodiments of the present invention provides a apparatus for generating and focusing primary charged particle beam onto a conductive or non-conductive specimen and collecting the released charged particles and/or X-ray from the specimen to form an image or a spectrum of the specimen. Merely by way of example, the present invention has been used to provide a low-landing scanning electron microscope, but it would be recognized that the invention has a much broader range of applicability.

As explained above, charged particle beam systems have a wide range of applications. For example, there are many reasons why low landing energy SEM is widely adopted in the semiconductor industry for inspection, defect review and CD measurement. For example, low landing energy charged particle beam causes less potential irradiation damage on the IC device. In addition, charging balance on the unfinished non-conductive IC wafer surface is achievable when the charged particle beam has a low landing energy, because for the most materials, the low landing energy (e.g. less than 3 keV) charged particle beam can achieve an efficiency close to unity of the total yield of the signal beam escaped from the specimen. Moreover, for the CD measurement, a low landing energy charged particle beam could minimize the slimming effect. The slimming effect is that the critical dimension of the photo-resist pattern will shrink when the charged particle beam scans on these patterns.

It is helpful to know the constituent of the defect in root cause hunting process. Therefore, a charged particle beam apparatus equipped with the energy dispersive X-ray analysis (EDX) capability is well received by chip manufacturer. As we know, silicon, carbon and tungsten are the substantial material during the processing of the semiconductor device. In order to analyze silicon, carbon and tungsten material with EDX, a relatively high landing energy, e.g. 12 keV or even higher, is necessary according to these element's characteristic x-ray spectrum.

Another important requirement for the low landing energy charged particle beam apparatus is the achievable resolution, i.e. the final beam spot size when the charged particle beam arrives at the specimen surface. The major factors affecting the spot size include chromatic aberration and diffraction blur when the aperture size is optimized for the high-resolution charged particle beam apparatus. The chromatic aberration is proportional to the column electron optics chromatic coefficient and the charged particle beam energy spread, which comes from the its emission process and the charged particle beam interaction. If the charged particle beam has a relatively high kinetic energy while passing the column, the energy spread caused by beam interaction can be reduced substantially.

In order to achieve higher resolution, a compound objective lens combining immersion magnetic lens and retarding electrostatic lens is widely adopted in the low landing energy SEM because of its low spherical and chromatic aberration coefficients. However, it is difficult to obtain a side-view SEM image with this compound objective lens layout. It also suffers from the saturation effect of the magnetic lens material when a high magnetic field is needed to focus the charged particle beam at high landing energies.

In this invention, a compound objective lens, consisting of a conical magnetic lens, an immersion magnetic lens and an electrostatic lens, and the corresponding methods of its operation will be disclosed. This invention will provide an effective solution to the conflict between the low landing energy mode for inspection, review and CD measurement and the high landing energy mode for the EDX analysis.

Reference will now be made in detail to specific embodiments of the invention. Examples of these embodiments are illustrated in the accompanying drawings. While the invention will be described in conjunction with these specific embodiments, it will be understood that it is not intended to limit the invention to these embodiments. In fact, it is intended to cover alternatives, modifications, and equivalents as may be included within the spirit and scope of the invention as defined by the appended claims. In the following description, numerous specific details are set forth in order to provide a through understanding of the present invention. The present invention may be practiced without some or all of these specific details. In other instances, well-known process operations are not described in detail in order not to obscure the present invention.

A preferred embodiment of the invented charged particle beam apparatus is described in FIG. 1. This diagram is merely an example, which should not unduly limit the scope of the claims. One of ordinary skill in the art would recognize many variations, alternatives, and modifications. Here the charged particle beam apparatus essentially includes the following:
1. a charged particle source (101, 102 and 103) for generating a primary particle beam (125) onto specimen (120);
2. a condenser lens (103, 104 and 105) for pre-focusing the primary charged particle beam (125), which can also form a crossover if necessary; a compound objective lens (115, 116, 118 and 120) for forming the magnetic field and the electrostatic field to focus the primary charged particle beam (125) onto the specimen (120) along the charged particle beam path; In order to apply various voltage onto the shared pole piece (116), the shared pole piece (116) is electrically insulated from the upper pole piece (115).
3. a detection system for detecting charged particles (111 and 124) or X-ray (121) emanated from the specimen (120) by the impingement of focused primary charged particle beam (125) on the specimen (120);
4. a deflection system for deflecting the primary charged particle beam (125) over the specimen (120) to form a scanning pattern;
5. an ExB alignment unit (114) for aligning the optical axis of the charged particle beam (111) released from the specimen (120) with the optical axis of the primary charged particle beam (125); and
6. an X-Y stage (126) and a Z stage (127) for moving the specimen (120) to the axial area and adjusting the specimen height to the focused-imaging plane of the primary charged particle beam (125).

According to a specific embodiment, the invented charged particle beam apparatus shown in the FIG. 1, further explanation is as follows: 106 and 107 could be an astigmatism corrector and/or beam blanker module. 108 is an objective aperture. 115 and 116 constitute a conical magnetic lens. 112 denotes the excitation coil of said conical magnetic lens; 116 and 118 constitute an immersion magnetic lens; 113 is excitation coil of said immersion magnetic lens; 115, 116 and 120 constitute an electrostatic lens. The distance from the bottom surface of the shared pole piece (116) to the specimen surface (120) can be a distance within the range from 1.0 to 8.0 millimeters. The bore size of the shared pole piece (116) can be a dimension within the range from 1.0 to 30.0 millimeters. These two dimensions are very critical to the electrostatic and magnetic field strength at the specimen surface and the achievable charged particle beam probe size. For a large field of view application case, a relative long distance between the shared pole piece (116) to the specimen surface (120) and larger bore size are preferred. For ultrahigh resolution application case, short distance between the shared pole piece (116) to the specimen surface (120) and small bore size are necessary. The detector system includes at least three detectors: an in-lens detector (109), an EDX detector (117) and a side detector (119); the preferred deflection system comprises a pre-lens deflector (110) and an in-lens deflector (122).

In an embodiment, the detection system includes an in-lens segmental detector, a first side detector. For example, the in-lens segmental detector has a pinhole on an axis of an optical axis, the pinhole size being approximately from 0.5 to 2.0 millimeters in diameter.

Figure 2:
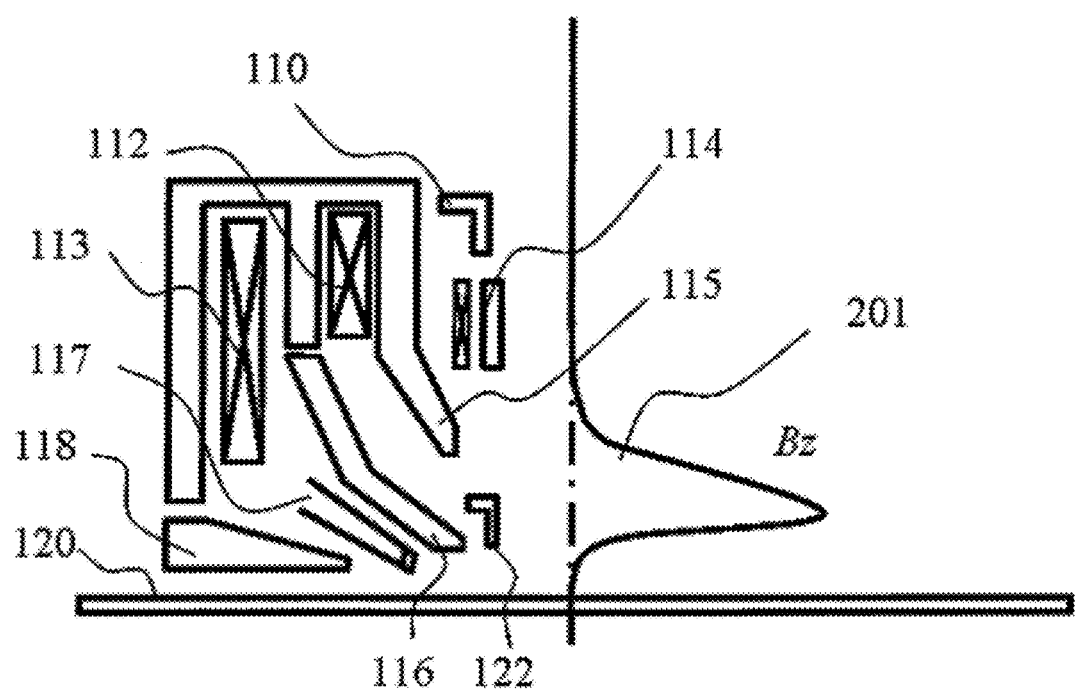
FIG. 2 is a simplified diagrammatic representation of a compound objective lens and the axial magnetic field distribution of the conical magnetic lens according to an embodiment of the present invention.

FIG. 2 is a simplified diagram illustrating a magnetic field distribution according to an embodiment of the present invention. This diagram is merely an example, which should not unduly limit the scope of the claims. One of ordinary skill in the art would recognize many variations, alternatives, and modifications. FIG. 2 shows a magnetic field distribution (201) along the charged particle beam axis of a specific embodiment of the conical magnetic lens (112, 115 and 116) when excitation current is applied only to the excitation coil (112). The conical magnetic lens will be very efficient in focusing primary charged particle beam (125) with high landing energy, due to its large working distance. In order to generate the characteristic X-ray of the elements of specimen, a landing energy up to 12 keV is necessary. For the conical magnetic lens mode, the magnetic field at the specimen surface is typically weak.

Figure 3:
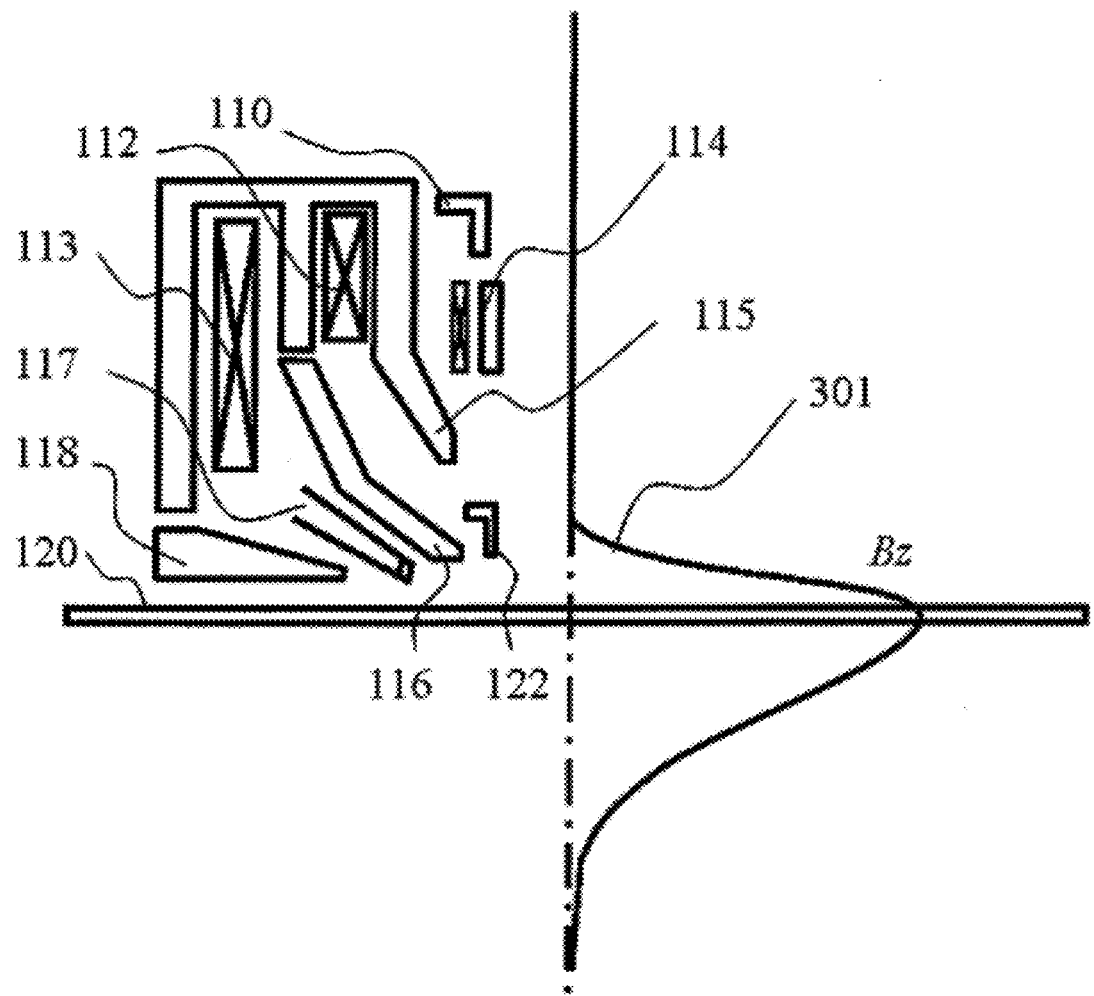
FIG. 3 is a simplified diagrammatic representation of a compound objective lens and the axial magnetic field distribution of the immersion magnetic lens according to an embodiment of the present invention.

FIG. 3 is a simplified diagram illustrating a magnetic field distribution according to an embodiment of the present invention. This diagram is merely an example, which should not unduly limit the scope of the claims. One of ordinary skill in the art would recognize many variations, alternatives, and modifications. More specifically, FIG. 3 shows a magnetic field distribution (301) along the charged particle beam axis of a preferred embodiment of the immersion magnetic lens (113, 116 and 118) when excitation current is applied only to the excitation coil (113). The immersion magnetic lens (113, 116 and 118) can be employed for focusing the primary charged particle beam (125) with low landing energy and achieving very high resolution.

Figure 4:
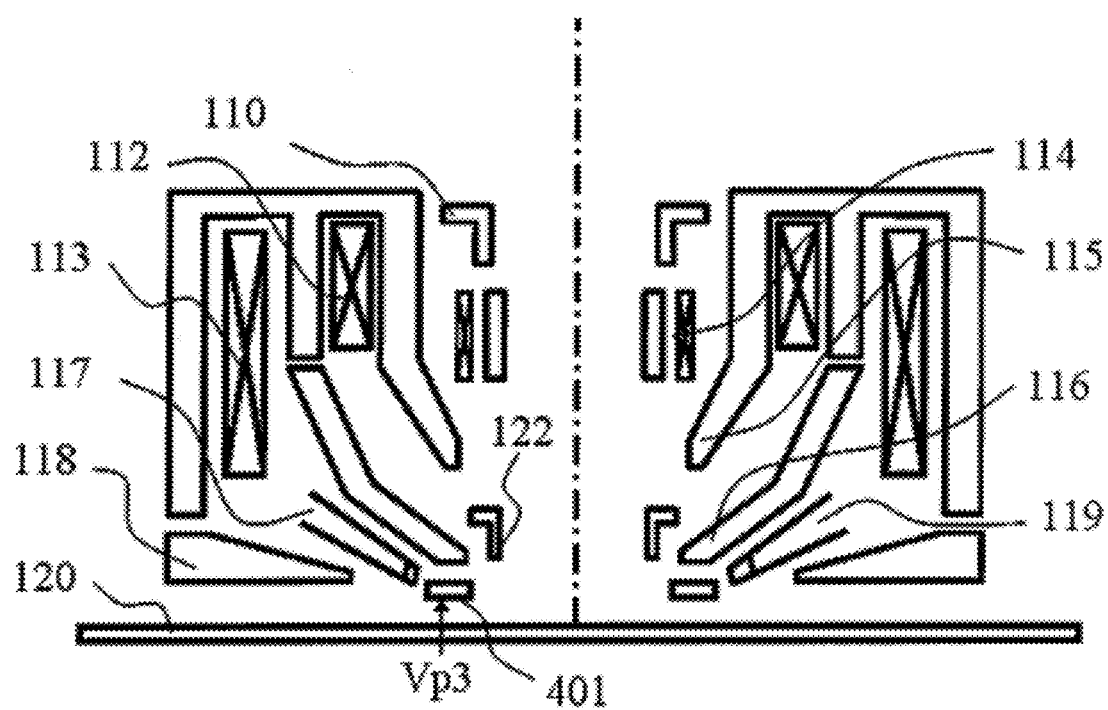
FIG. 4 is a simplified diagrammatic representation of schematic drawing of the compound objective lens with an electrostatic electrode positioned between the shared pole piece of the magnetic lenses and the specimen according to an embodiment of the present invention.

FIG. 4 is a simplified diagram illustrating a compound objective lens according to an embodiment of the present invention. This diagram is merely an example, which should not unduly limit the scope of the claims. One of ordinary skill in the art would recognize many variations, alternatives, and modifications. More specifically, FIG. 4 illustrates a preferred embodiment of the compound objective lens with an optional electrostatic electrode (401) between the shared pole piece (116) and the specimen (120). Voltage Vp3 is supplied to the electrostatic electrode (401) to influence the electric field strength at the specimen surface. This layout is helpful to obtain high resolution and stable scanning image of the specimen (120). The electrostatic electrode (401) can also function as an electrostatic deflector to scan the primary charged particle beam over the specimen surface.

FIGS. 5 to 8 are simplified diagrams illustrating operation modes and the corresponding axial potential voltage distribution according to embodiments of the present invention. There diagrams merely provide an example, which should not unduly limit the scope of the claims. One of ordinary skill in the art would recognize many variations, alternatives, and modifications. More specifically, FIG. 5 to FIG. 8 illustrate some preferred operation modes and the corresponding axial potential voltage distribution (501, 601, 701 and 801) of the charged particle apparatus embodiment shown in FIG. 1. For these preferred operation modes, the primary charged particle beam (125) is pre-focused by providing a voltage Vcl to the electrode (104) of the condenser lens.

Figure 5:
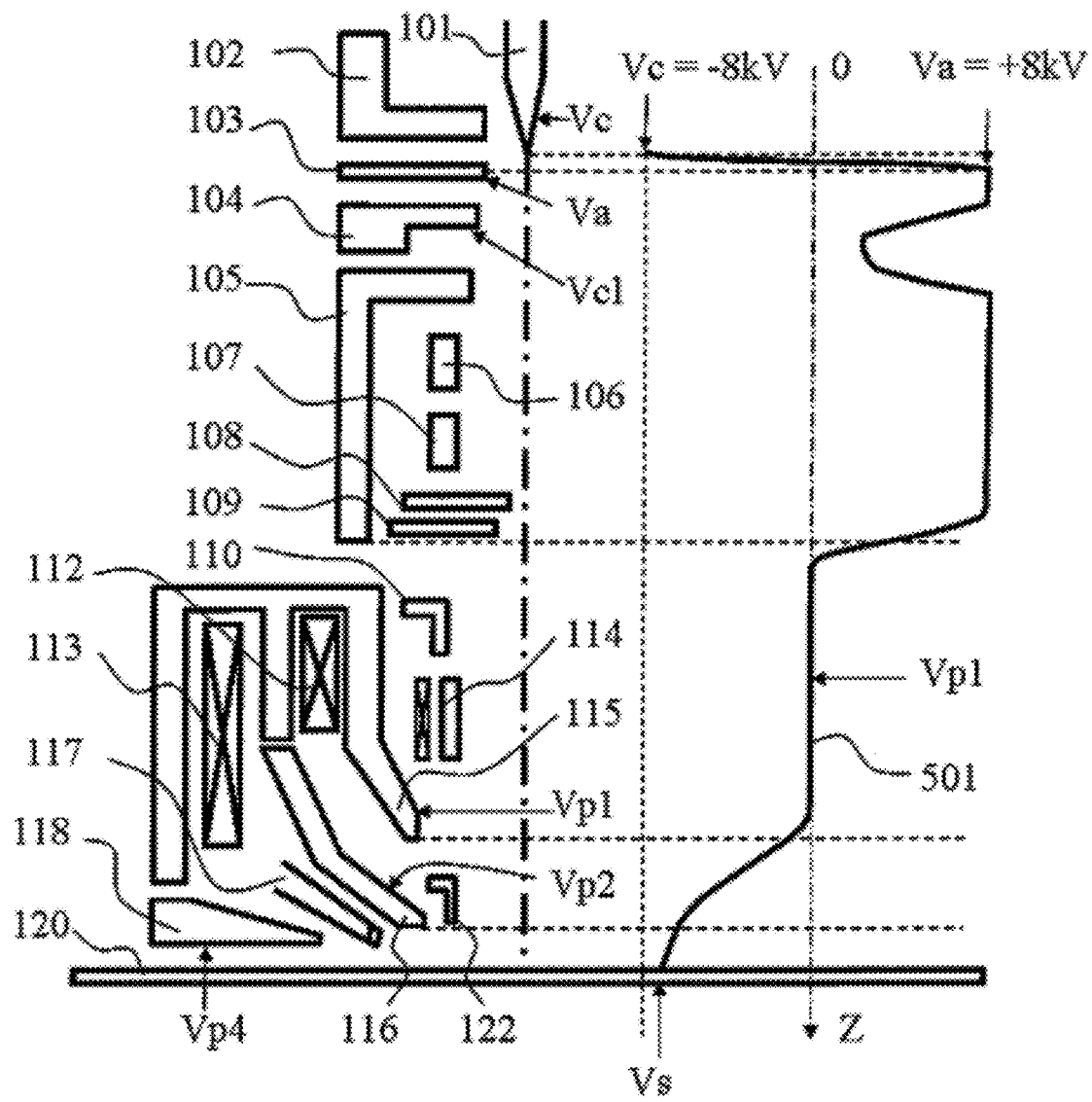
FIG. 5 is a simplified diagrammatic representation of the charged particle apparatus (where a cathode of the charged particle source is supplied a voltage Vc of −8 kV and the anode and condenser lens body have the same voltage Va=+8 kV, and Vs is negative) and the axial field distribution at various voltages according to an embodiment of the present invention.

A preferred operation in FIG. 5, a cathode (101) of the charged particle source is supplied a voltage Vc of −8 kV and the anode and condenser lens body have the same voltage Va=+8 kV. The charged particles is released from the cathode (101) are thus accelerated to 16 keV (Va−Vc=16 kV). The upper pole piece (115) of the conical magnetic lens has a voltage of Vp1=0V. The voltage on the specimen (120) is set as Vs, which varies from −8 kV to −3 kV. The landing energy of the primary charged particle beam is Vs−Vc, whose range will be from 0 eV to 3 keV. The voltage Vp2 of the shared pole piece (116) is adjustable; and its range is from Vs−2 kV to Vs+7 kV. The voltage difference (Vp2−Vs) between the shared pole piece (116) and the specimen surface (120) should not beyond the value that can cause the breakdown to happen between these two electrodes. When the preferred charged particle beam apparatus works at this mode, usually the immersion magnetic lens (113,116 and 118) will be the primary magnetic focusing lens. The signal charged particle beam (111, shown in FIG. 1) is released from the specimen (120) will be accelerated by the extraction electric field along the reverse direction of the primary charged particle beam (125) and collected by the detector (109).

Figure 6:
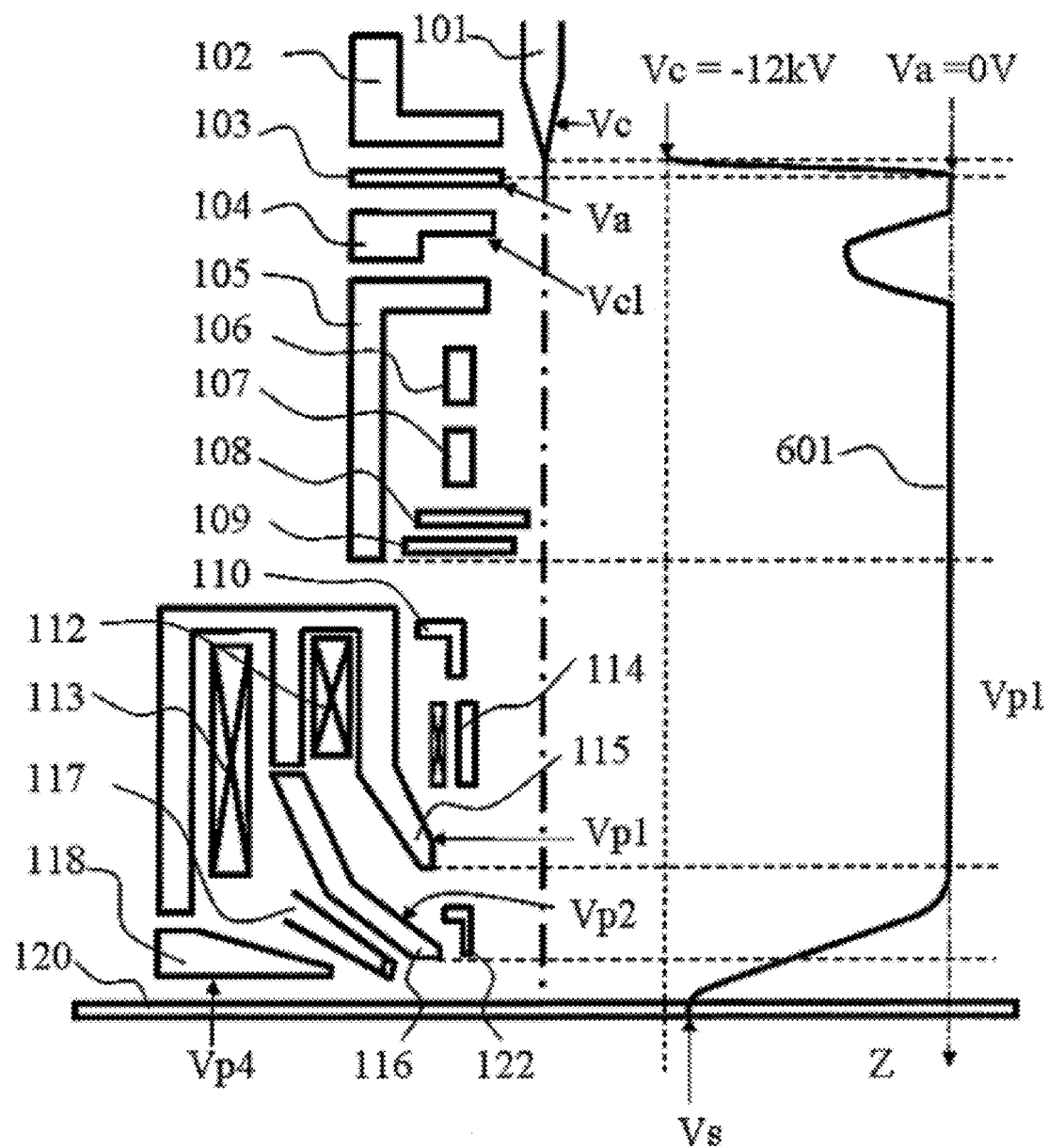
FIG. 6 is a simplified diagrammatic representation of the charged particle apparatus (where a cathode of the charged particle source is supplied a voltage Vc of −12 kV and the anode and condenser lens body have the same voltage Va=0 kV, and Vs is negative) and the axial field distribution at various voltages according to an embodiment of the present invention.

Another preferred operation in FIG. 6, the cathode (101) of the charged particle source is supplied a voltage of −12 kV, and the anode and condenser lens body are grounded, i.e. Va=0V. The charged particles released from the cathode (101) are accelerated to 12 keV. The objective lens pole piece (115) has a potential of Vp1=0. The voltage of the specimen (120) is set at Vs, whose range is from −12 kV to −7 kV. The landing energy of the primary charged particle beam is Vs−Vc, whose range is from 50 eV to 3 keV. The voltage Vp2 of the shared pole piece (116) is adjustable, and its range varies from Vs−2 kV to Vs+7 kV. The voltage difference (Vp2−Vs) between the shared pole piece (116) and the specimen surface (120) should not beyond the value that can cause the breakdown to happen between these two electrodes. When the preferred charged particle beam apparatus works at this mode, usually the immersion magnetic lens (113,116 and 118) will be the primary magnetic focusing lens. The signal charged particle beam (111) released from the specimen (120) will be accelerated by the extraction electric field along the reverse direction of the primary charged particle beam and collected by the detector (109).

Figure 7:
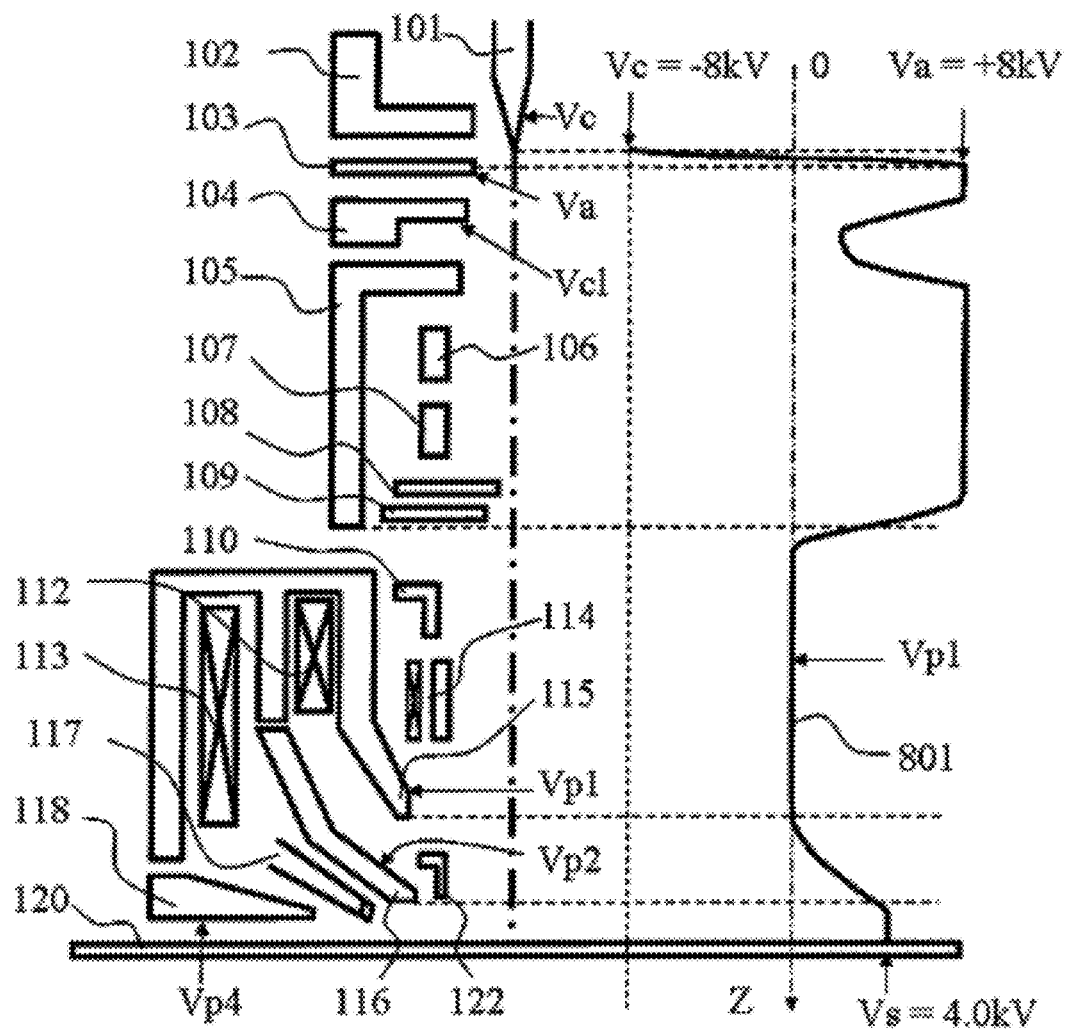
FIG. 7 is a simplified diagrammatic representation the charged particle apparatus (where a cathode of the charged particle source is supplied a voltage Vc of −8 kV and the anode and condenser lens body have the same voltage Va=+8 kV, and Vs is positive) using a supply voltage of −8 kV and the axial field distribution at various voltages according to an embodiment of the present invention.

Another preferred operation in FIG. 7, the cathode (101) of the charged particle source has a voltage of −8 kV and the anode and condenser lens body have same voltage Va=+8 kV. The charged particles released from the cathode (101) are accelerated to 16 keV. The upper pole piece (115) has a voltage of Vp1=0 V. The voltage of the specimen (120) is set at Vs=4 kV. The landing energy of primary charged particle beam is 12 keV. When the preferred charged particle beam apparatus work at this mode, usually the conical magnetic lens (113, 115 and 116) will be the primary magnetic focusing lens. The secondary charged particle beam (124) released from the specimen (120) would be extracted onto side detector (119, which shown in FIG. 1) by a weak extraction electric field, which has a negligible effect on the primary charged particle beam trajectory. In this operation mode the detector (117) will collect the X-ray (121) released from the specimen. The in-lens detector (109) will collect most of the back-scattered charged particles released from the specimen (120).

Figure 8:
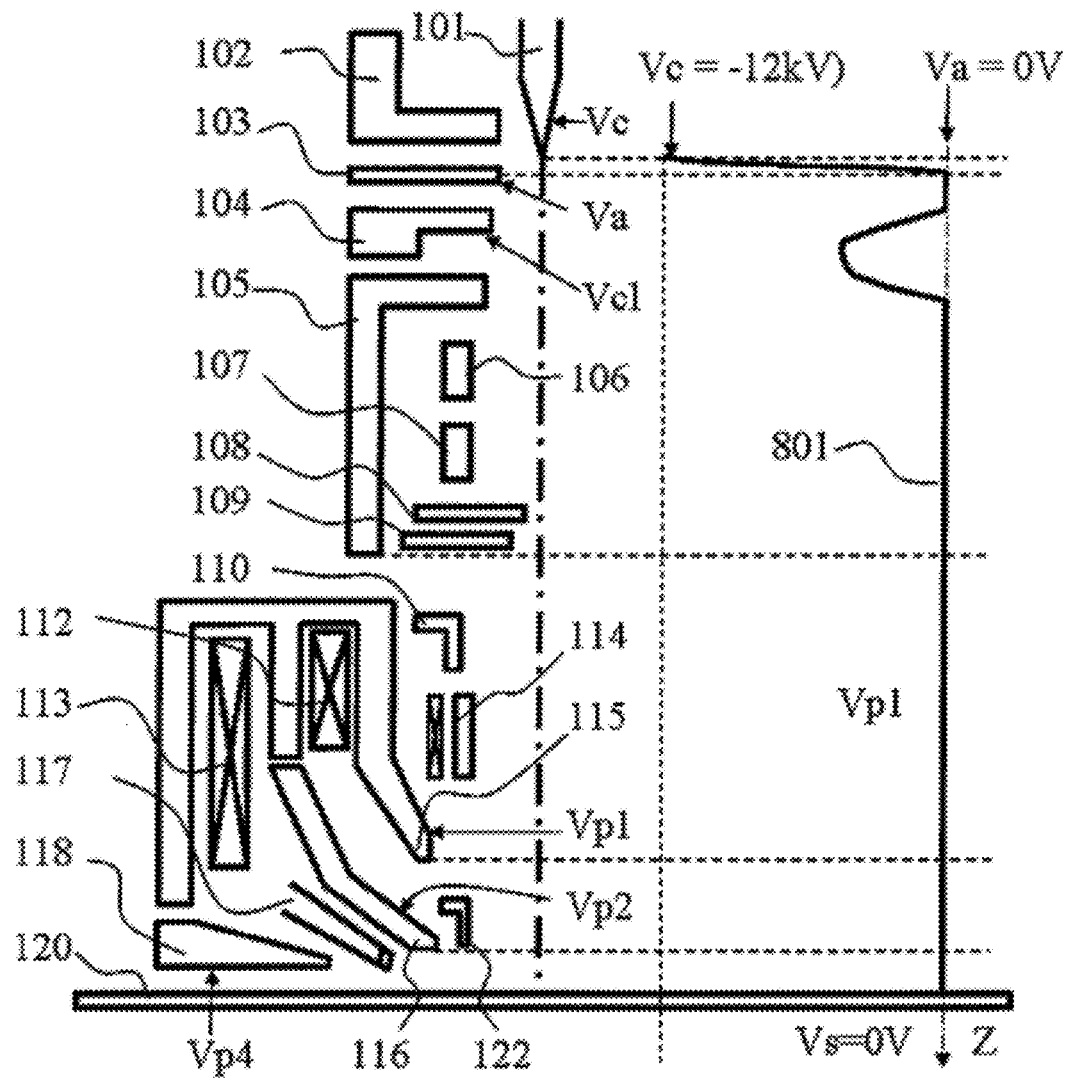
FIG. 8 is a simplified diagrammatic representation of the charged particle apparatus (where a cathode of the charged particle source is supplied a voltage Vc of −12 kV and the anode and condenser lens body have the same voltage Va=0 kV, and Vs is positive) and the axial field distribution at various voltages according to an embodiment of the present invention.

And yet another preferred operation in FIG. 8, the cathode (101) of the charged particle source has a voltage of −12 kV and the anode and condenser lens body have same voltage Va=0 V. The charged particles released from the cathode (101) are accelerated to 12 keV. The upper pole piece (115) has a voltage of Vp1=0 V. The voltage on the specimen (120) is set at 0 V. The landing energy of the primary charged particle beam is 12 keV. When the preferred charged particle beam apparatus work at this mode, usually the conical magnetic lens (112, 115 and 116) will be the primary magnetic focusing lens. The secondary charged particle beam (124) released from the specimen (120) would be extracted onto side detector (119, which shown in FIG. 1) by a weak extraction electric field, which has a negligible effect on the primary charged particle beam trajectory. In this operation mode the detector (117) will collect the X-ray (121) released from the specimen. The in-lens detector (111) will collect most of the back-scattered charged particles released from the specimen (120).

According to an embodiment, the compound objective lens as shown in FIG. 4 is adopted into the embodiment of the charged particle beam apparatus shown in FIG. 1. For example, voltage Vp2 can be set to same as Vp1, and only change the voltage Vp3 on the electrostatic electrode to adjust the electric field strength at the specimen surface.

According an embodiment, the present invention provides a charged particle beam apparatus. The apparatus includes a charged particle source for generating a primary charged particle beam. The apparatus also includes at least one condenser lens for pre-focusing the primary charge particle beam. Furthermore, the apparatus includes a compound objective lens for forming the magnetic field and the electrostatic field to focus the primary charged particle beam onto a specimen in the charged particle beam path. The specimen includes a specimen surface. The compound objective lens includes a conical magnetic lens, an immersion magnetic lens, and an electrostatic lens, the conical magnetic lens including an upper pole piece, a shared pole piece being electrically insulated from the upper pole piece, and an excitation coil. A bottom surface of the shared pole piece is approximately 1 to 8 millimeters from the specimen. The pole piece is characterized by a bore diameter of approximately 1 to 30 millimeters. The apparatus also includes a detection system for detecting signal charged particles or X-ray emanated from the specimen. The apparatus further includes an ExB filter for aligning or bending the signal charged particle beam to detector. Moreover, the apparatus includes a deflection system for deflecting the primary charged particle beam over the specimen surface to form a scanning pattern. Additionally, the apparatus includes a stage system for supporting and moving the specimen. For example, the embodiment is illustrated according to FIG. 1.

Although specific embodiments of the present invention have been described, it will be understood by those of skill in the art that there are other embodiments that are equivalent to the described embodiments. Accordingly, it is to be understood that the invention is not to be limited by the specific illustrated embodiments, but only by the scope of the appended claims.

What is claimed is:

1. A charged particle beam apparatus, comprising:
   a charged particle source for generating a primary charged particle beam;
   at least one condenser lens for condensing the primary charged particle beam;
   a compound objective lens for focusing the primary charged particle beam to a specimen on a stage system, the compound objective lens comprising:
      a first magnetic lens;
      a second magnetic lens, wherein a shared pole piece is configured for both the first magnetic lens and the second magnetic lens; and
      an electrostatic lens; and
   a detection system for detecting charged particles or X-ray emanated from the specimen.

2. The charged particle beam apparatus of claim 1, wherein the first magnetic lens comprises an upper pole piece and a first excitation coil with the shared pole piece and the upper pole piece.

3. The charged particle beam apparatus of claim 2, wherein the second magnetic lens comprises a lower pole piece and a second excitation coil within the shared pole piece and the lower pole piece.

4. The charged particle beam apparatus of claim 3, wherein the shared pole piece is isolated from the upper pole piece.

5. The charged particle beam apparatus of claim 4, wherein the shared pole piece is isolated from the lower pole piece.

6. The charged particle beam apparatus of claim 5, wherein the electrostatic lens comprises the upper pole piece, the shared pole piece, and the specimen.

7. The charged particle beam apparatus of claim 6, wherein the first magnetic lens is conical.

8. The charged particle beam apparatus of claim 7, wherein the second magnetic lens is an immersion lens.

9. The charged particle beam apparatus of claim 3, wherein the lower pole piece is isolated from the second magnetic lens.

10. The charged particle beam apparatus of claim 5, wherein the lower pole piece is isolated from the second magnetic lens.

11. The charged particle beam apparatus of claim 1, wherein the shared pole piece is electrically isolated from the first magnetic lens and the second magnetic lens.

12. A scanning electron microscope, comprising:
    an electron source for generating a primary electron beam;
    at least one condenser lens for condensing the primary electron beam;
    a compound objective lens for focusing the primary electron beam to a specimen on a stage system, the compound objective lens comprising:
       a conical magnetic lens;
       an immersion magnetic lens, wherein a shared pole piece is configured for both the conical magnetic lens and the immersion magnetic lens; and
       an electrostatic lens;
    a deflection system for deflecting the primary electron beam over a surface of the specimen to form a scanning pattern; and
    a detection system for detecting secondary electrons or X-ray emanated from the specimen.

13. The scanning electron microscope of claim 12, wherein the shared pole piece is electrically isolated from the conical magnetic lens and the immersion magnetic lens.

14. The scanning electron microscope of claim 13, wherein the conical magnetic lens comprises an upper pole piece and a first excitation coil with the shared pole piece and the upper pole piece.

15. The scanning electron microscope of claim 14, wherein the immersion magnetic lens comprises a lower pole piece and a second excitation coil within the shared pole piece and the lower pole piece.

16. The scanning electron microscope of claim 15, wherein the shared pole piece is isolated from the upper pole piece and the lower pole piece.

17. The scanning electron microscope of claim 16, wherein the lower pole piece is isolated from the immersion magnetic lens.

18. The scanning electron microscope of claim 15, wherein the electrostatic lens comprises the upper pole piece, the shared pole piece, and the specimen.

19. The scanning electron microscope of claim 12, further comprising an ExB filter for aligning or bending the secondary electrons to the detection system.

20. An E-beam inspection apparatus, comprising:
    an electron source for generating a primary electron beam;
    at least one condenser lens for condensing the primary electron beam;
    a compound objective lens for focusing the primary electron beam to a specimen on a stage system, the compound objective lens comprising:
       a conical magnetic lens including an upper pole piece, a shared pole piece, and a first excitation coil with the shared pole piece and the upper pole piece;
       an immersion magnetic lens including a lower pole piece, the shared pole piece and a second excitation coil within the shared pole piece and the lower pole piece; and
       an electrostatic lens configured by the upper pole piece, the shared pole piece, and the specimen;
    a deflection system for deflecting the primary electron beam over a surface of the specimen to form a scanning pattern;
    a detection system for detecting secondary electrons or X-ray emanated from the specimen; and
    an ExB filter for aligning or bending the secondary electrons to the detection system.

* * * * *